United States Patent
Saito et al.

(10) Patent No.: US 9,136,291 B2
(45) Date of Patent: Sep. 15, 2015

(54) SOLID-STATE IMAGING DEVICE HAVING PENETRATION ELECTRODE FORMED IN SEMICONDUCTOR SUBSTRATE

(75) Inventors: Mariko Saito, Yokohama (JP); Ikuko Inoue, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 654 days.

(21) Appl. No.: 13/490,768

(22) Filed: Jun. 7, 2012

(65) Prior Publication Data

US 2012/0252156 A1 Oct. 4, 2012

Related U.S. Application Data

(62) Division of application No. 12/629,322, filed on Dec. 2, 2009, now abandoned.

(30) Foreign Application Priority Data

Feb. 13, 2009 (JP) ................... 2009-031430

(51) Int. Cl.
  *H01L 27/146* (2006.01)
  *H01L 31/02* (2006.01)
  (Continued)

(52) U.S. Cl.
  CPC .... *H01L 27/14618* (2013.01); *H01L 21/76898* (2013.01); *H01L 23/481* (2013.01); *H01L 27/14621* (2013.01); *H01L 27/14627* (2013.01); *H01L 27/14636* (2013.01);
  (Continued)

(58) Field of Classification Search
  CPC .. H01L 31/02002; H01L 23/481; H01L 31/18
  See application file for complete search history.

(56) References Cited

U.S. PATENT DOCUMENTS

| 8,138,533 B2 * | 3/2012 | Koike et al. ................. 257/292 |
| 2007/0181792 A1 | 8/2007 | Yoshimoto et al. |

(Continued)

FOREIGN PATENT DOCUMENTS

| JP | 2006-339566 | 12/2006 |
| JP | 2007-53149 | 3/2007 |

(Continued)

OTHER PUBLICATIONS

Office Action issued Oct. 23, 2012 in Japanese Patent Application No. 2009-031430 (with English translation).

*Primary Examiner* — Phat X Cao
*Assistant Examiner* — Diana C Vieira
(74) *Attorney, Agent, or Firm* — Oblon, McClelland, Maier & Neustadt, L.L.P.

(57) ABSTRACT

A solid-state imaging device includes an imaging element, an external terminal, an insulating film, a penetration electrode, a first insulating interlayer, a first electrode, and a first contact plug. The imaging element is formed on a first main surface of a semiconductor substrate. The external terminal is formed on a second main surface facing the first main surface of the substrate. The insulating film is formed in a through-hole formed in the substrate. The penetration electrode is formed on the insulating film in the through-hole and electrically connected to the external terminal. The first insulating interlayer is formed on the first main surface of the substrate and the penetration electrode. The first electrode is formed on the first insulating interlayer. The first contact plug is formed in the first insulating interlayer between the penetration electrode and the first electrode to electrically connect the penetration electrode and the first electrode.

18 Claims, 6 Drawing Sheets

(51) Int. Cl.
  *H01L 21/768* (2006.01)
  *H01L 23/48* (2006.01)
(52) U.S. Cl.
  CPC .............. *H01L 31/02002* (2013.01); *H01L 2224/02372* (2013.01); *H01L 2224/0401* (2013.01); *H01L 2224/05548* (2013.01); *H01L 2224/06181* (2013.01); *H01L 2224/13022* (2013.01); *H01L 2224/13024* (2013.01)

(56) References Cited

U.S. PATENT DOCUMENTS

| 2007/0201114 | A1 | 8/2007 | Egawa |
| 2008/0284041 | A1* | 11/2008 | Jang et al. ............. 257/774 |
| 2009/0283847 | A1 | 11/2009 | Kawasaki et al. |
| 2010/0187557 | A1 | 7/2010 | Samoilov et al. |
| 2011/0122303 | A1 | 5/2011 | Bonkohara |

FOREIGN PATENT DOCUMENTS

| JP | 2009-16691 | 1/2009 |
| JP | 2009-194399 | 8/2009 |
| JP | 2010-514177 | 4/2010 |

* cited by examiner

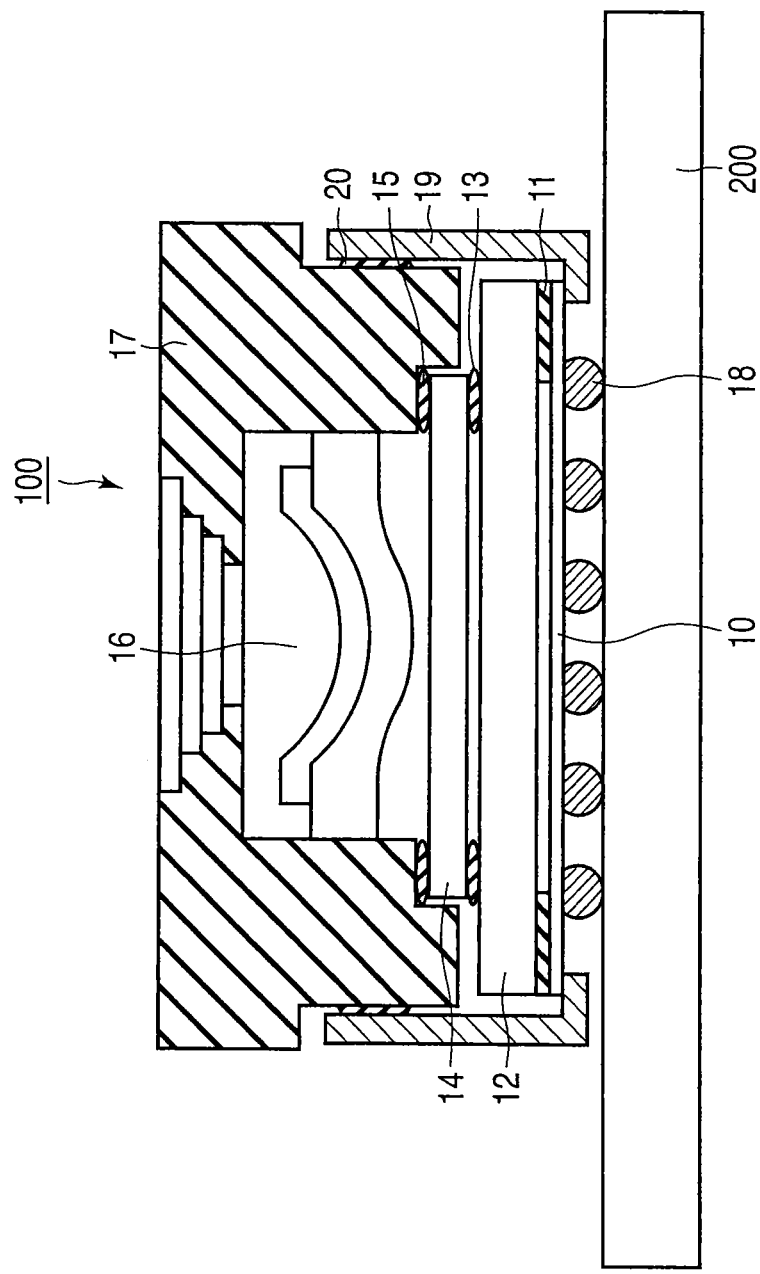
F I G. 1

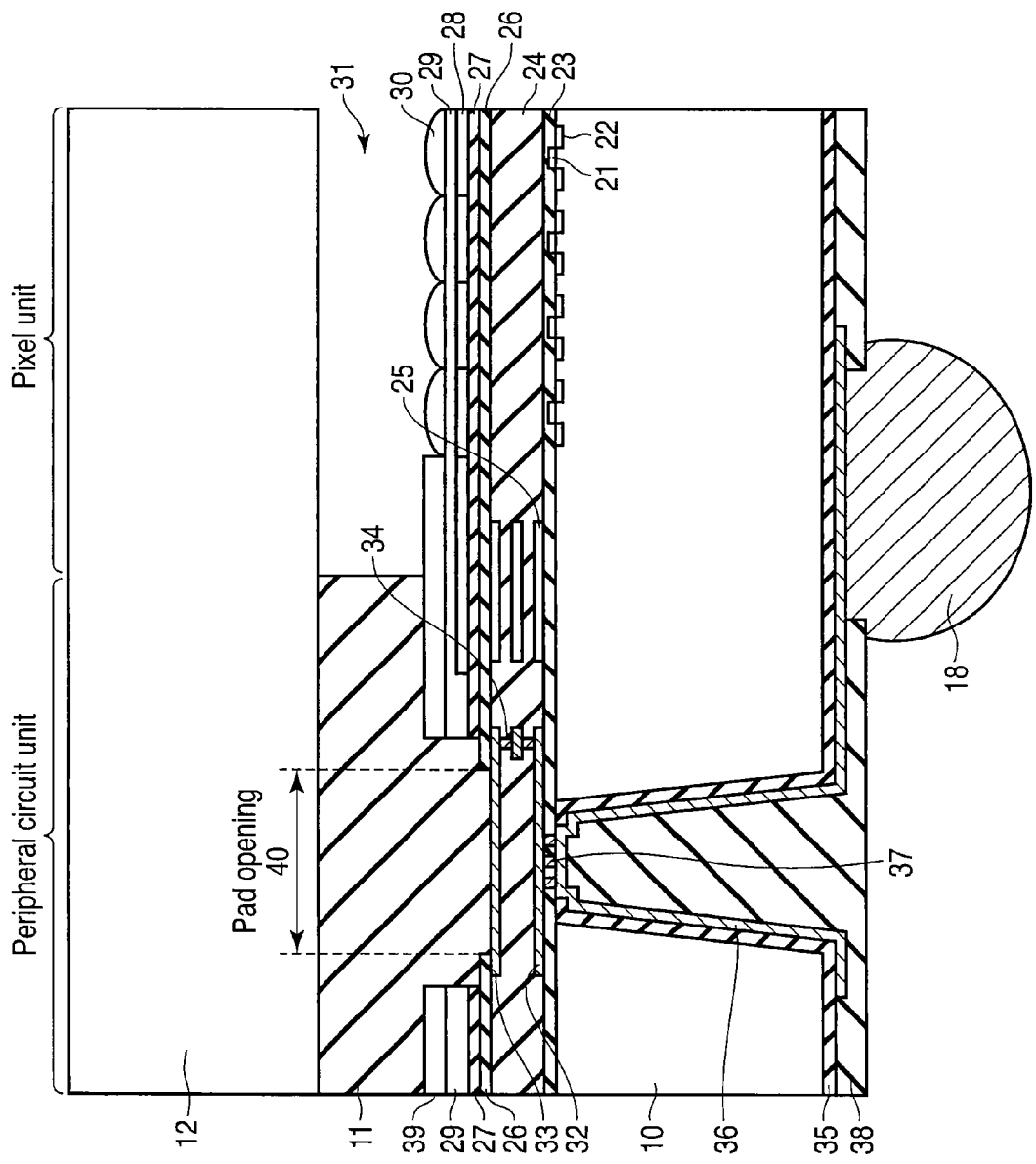
F I G. 2

SOLID-STATE IMAGING DEVICE HAVING PENETRATION ELECTRODE FORMED IN SEMICONDUCTOR SUBSTRATE

CROSS-REFERENCE TO RELATED APPLICATIONS

This application is a divisional of U.S. application Ser. No. 12/629,322 filed Dec. 2, 2009, and is based upon and claims the benefit of priority from prior Japanese Patent Application No. 2009-031430, filed Feb. 13, 2009, the entire contents of each of which are incorporated herein by reference.

BACKGROUND OF THE INVENTION

1. Field of the Invention

The present invention relates to a solid-state imaging device having a penetration electrode formed in a semiconductor substrate, for example, a camera module.

2. Description of the Related Art

In recent years, miniaturization of various electronic appliances has progressed, and a solid-state imaging device having a semiconductor image sensor is also required to be miniaturized. As one technique to realize the miniaturization, there is a penetration electrode in which a through-hole is formed to extend from a rear surface side of a semiconductor chip on which a semiconductor image sensor is formed to an internal electrode on a front surface side so as to electrically connect an electrode on the rear surface side to the internal electrode on the front surface side through a conductor layer buried in the through-hole.

A conventional method of forming a penetration electrode has the following structure, for example. A through-hole is formed to extend from a rear surface side of a silicon substrate to a front surface side. Thereafter, an insulating film is formed in the through-hole. After the through-hole is extended to the insulating film and an insulating interlayer which are present between a bottom surface of the through-hole and an internal electrode, a conductor layer (penetration electrode) is buried in the through-hole (for example, see Jpn. Pat. Appln. KOKAI Publication No. 2007-53149).

However, when the through-hole is formed in the insulating interlayer, a small-size through-hole having a diameter ranging from about 20 to 30 μm is formed. For this reason, a resist film thickness must be made large, and the manufacturing cost increases because a long developing time is required to pattern the resist. The insulating film formed on the silicon substrate in the through-hole is damaged by plasma asher used in removal of the resist, and a short circuit occurs between the silicon substrate and the conductor layer.

BRIEF SUMMARY OF THE INVENTION

According to an aspect of the present invention, there is provided a solid-state imaging device comprising: an imaging element formed on a first main surface of a semiconductor substrate; an external terminal formed on a second main surface facing the first main surface of the semiconductor substrate; an insulating film formed in a through-hole formed in the semiconductor substrate; a penetration electrode formed on the insulating film in the through-hole and electrically connected to the external terminal; a first insulating interlayer formed on the first main surface of the semiconductor substrate and the penetration electrode; a first electrode formed on the first insulating interlayer; and a first contact plug formed in the first insulating interlayer between the penetration electrode and the first electrode to electrically connect the penetration electrode and the first electrode to each other.

BRIEF DESCRIPTION OF THE SEVERAL VIEWS OF THE DRAWING

FIG. 1 is a sectional view showing a configuration of a camera module according to an embodiment of the present invention;

FIG. 2 is an enlarged sectional view of portions of a silicon semiconductor substrate and a glass substrate in the camera module according to the embodiment;

DETAILED DESCRIPTION OF THE INVENTION

Figure 3:
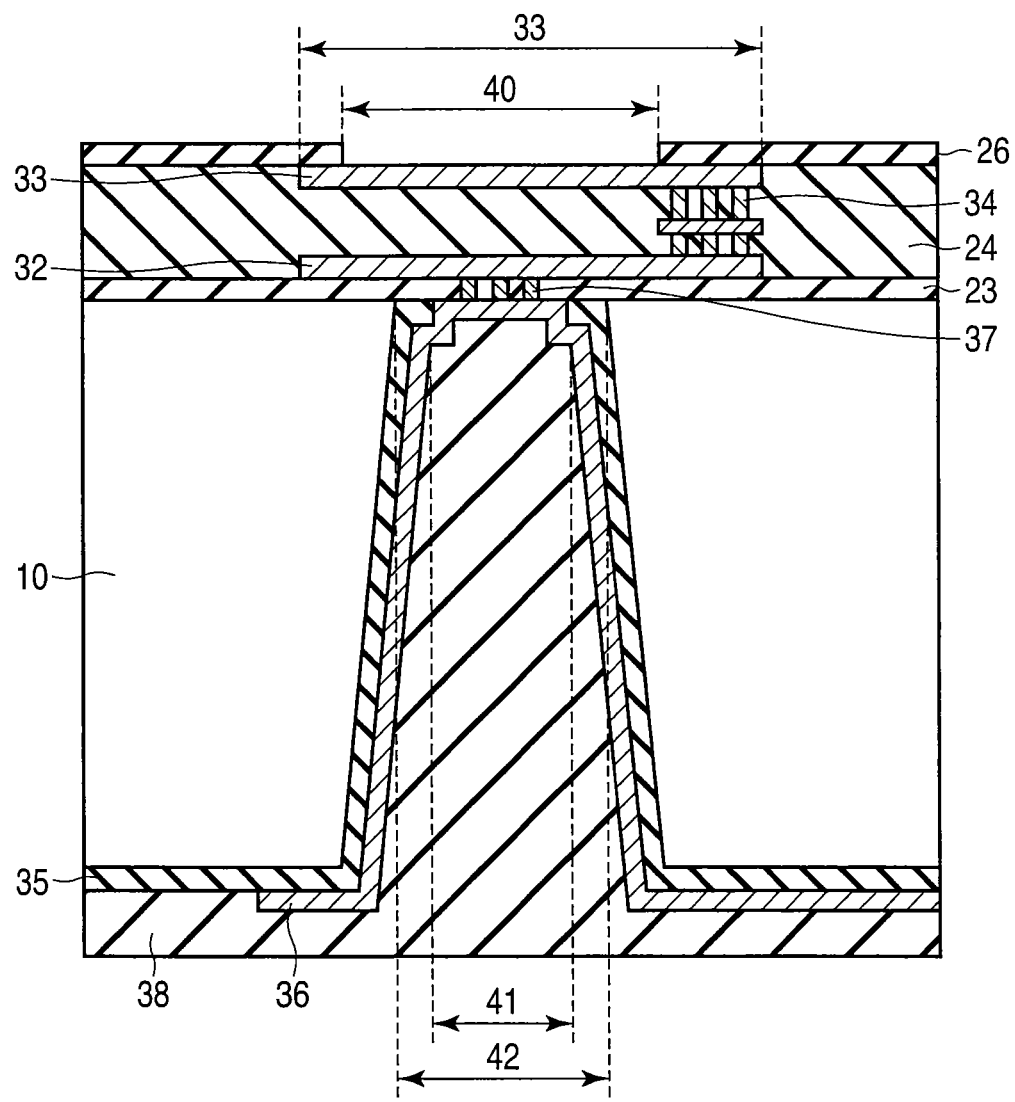
FIG. 3 is an enlarged sectional view of a penetration electrode and an electrode pad portion in the camera module according to the embodiment.

An embodiment of the present invention will be described below with reference to the accompanying drawings. In this embodiment, a camera module is exemplified as a solid-state imaging device. In this explanation, the same reference numerals as in all the drawings denote the same parts in the drawings.

FIG. 1 is a sectional view showing a configuration of a camera module according to an embodiment of the present invention. On a first main surface of a silicon semiconductor substrate (imaging element chip) 10 on which an imaging element (not shown) is formed, an optically transparent substrate, for example, a glass substrate 12 is formed through an adhesive agent 11. An infrared (IR) cut filter 14 is arranged on the glass substrate 12 through an adhesive agent 13, and a lens holder 17 including an imaging lens 16 is arranged on the IR cut filter 14 through an adhesive agent 15. On a second main surface of the silicon semiconductor substrate 10 facing the first main surface, an external terminal (electrode), for example, a solder ball 18 is formed. A light-shielding and electromagnetic shield 19 is arranged around the silicon semiconductor substrate 10 and the glass substrate 12, and the light-shielding and electromagnetic shield 19 is caused to adhere to the lens holder 17 by an adhesive agent 20. With this structure, a camera module 100 is formed.

The camera module 100 is directly mounted (chip-on-board [COB]) on a mounting substrate 200 consisting of, for example, a resin or ceramics through the solder ball 18.

Sectional structures of the silicon semiconductor substrate 10 and the glass substrate 12 in FIG. 1 will be described below in detail. FIG. 2 is an enlarged sectional view of portions of a silicon substrate and a glass substrate in the camera module according to the embodiment. The camera module has an imaging pixel unit in which an imaging element 21 is formed and a peripheral circuit unit which processes a signal output from the imaging pixel unit.

The imaging pixel unit of the camera module has the following configuration. On the first main surface of the silicon semiconductor substrate 10, element isolation insulating layers (for example, shallow trench isolation [STI]) 22 and element regions isolated by the element isolation insulating layers 22. In the element region, the imaging element 21 including a photodiode and a transistor is formed. An insulating interlayer 23 is formed on the first main surface on which the imaging element 21 is formed, and an insulating interlayer 24 is formed on the insulating interlayer 23. Furthermore, in the insulating interlayer 24, an interconnection 25 is formed in the insulating interlayer 24.

On the insulating interlayer 24, a passivation film 26 is formed, and a base layer 27 is formed on the passivation film 26. On the base layer 27, color filters 28 are formed to correspond the imaging elements 21. On the color filter 28, an overcoat 29 is formed. On the overcoat 29, microlenses 30 are formed to correspond to the imaging elements 21 (or color filters 28). Furthermore, a cavity 31 is formed above the microlenses 30, and an optically transparent support substrate (transparent substrate), for example, the glass substrate 12 is arranged above the cavity 31.

In the peripheral circuit unit of the camera module, the following penetration electrode and the following electrode pad are formed. The insulating interlayer 23 is formed on the first main surface of the silicon semiconductor substrate 10, and an internal electrode 32 is formed on the insulating interlayer 23. In the insulating interlayer 24 between the internal electrode 32 and an element surface electrode 33, a contact plug 34 which electrically connects these electrodes to each other is formed. The contact plug 34 is formed in a region which does not overlap the through-hole when being viewed from a direction perpendicular to the first main surface. The element surface electrode 33 is used to apply a voltage and read a signal through, for example, the contact plug 34 and the internal electrode 32. For example, in a die sort test, a test probe is brought into contact with the element surface electrode 33.

In the silicon semiconductor substrate 10, a through-hole extending from a second main surface to the first main surface, i.e., the second main surface to the insulating interlayer 23 is formed. An insulating film 35 is formed on a side surface of the through-hole and the second main surface. Furthermore, on an internal surface of the through-hole, i.e., on the insulating film 35 and the insulating interlayer 23, a conductor layer (penetration electrode) 36 is formed. In this case, in the insulating interlayer 23 between the conductor layer 36 and the internal electrode 32, a contact plug 37 which electrically connects the conductor layer 36 and the internal electrode 32 to each other is formed. The contact plug 37 is arranged in a region in which the conductor layer 36 and the insulating interlayer 23 are in contact with each other when being viewed from a direction perpendicular to the first main surface. The internal electrode 32 is electrically connected to a peripheral circuit (not shown) formed in the imaging elements 21 or the peripheral circuit unit. In this manner, the penetration electrode formed in the through-hole electrically connects the solder ball 18 and the imaging elements 21 or the peripheral circuit to each other.

On the conductor layer 36 and the insulating film 35 on the second main surface, a protecting film, for example, a solder resist 38 is formed. Furthermore, on the second main surface, the solder resist 38 on the conductor layer 36 is partially bored, and the solder ball 18 is formed on the exposed conductor layer 36.

On the element surface electrode 33, the conductor layer 36 is formed. The base layer 27 is formed on the passivation film 26, and the overcoat 29 is formed on the base layer 27. A styrene resin layer 39 is formed on the overcoat 29. The passivation film 26, the base layer 27, the overcoat 29, and the styrene resin layer 39 which are arranged on the element surface electrode 33 are bored to form a pad opening 40. On the styrene resin layer 39 and the element surface electrode 33, the glass substrate 12 is formed through the adhesive agent 11. The adhesive agent 11 is patterned and is not arranged on the imaging elements 21 (on the microlenses 30).

The solder resist 38 consists of, for example, a phenolic resin, a polyimide resin, an amine resin, or the like. As the solder ball 18, for example, Sn—Pb (eutectic) or 95Pb—Sn (high-lead high-melting-point solder) is used. As a Pb-free solder, Sn—Ag, Sn—Cu, Sn—Ag—Cu, or the like is used.

Figure 4:
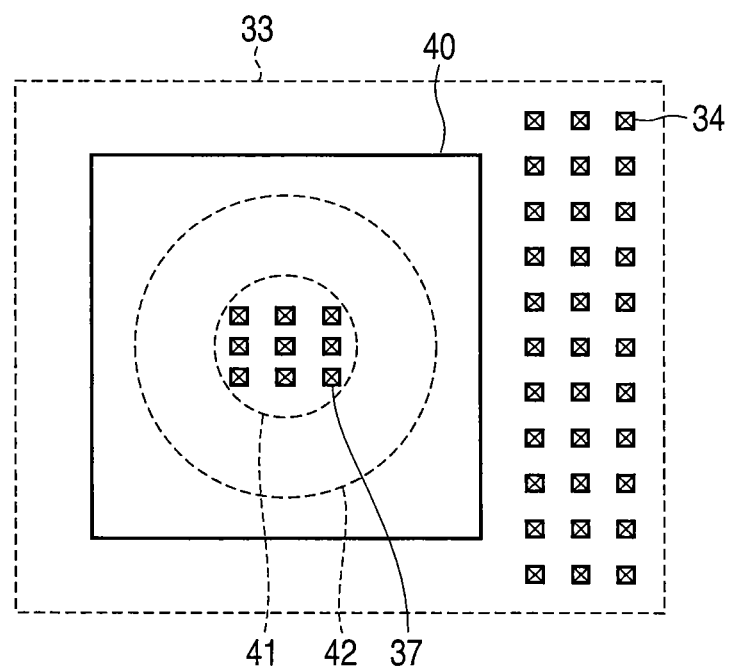
FIG. 4 is a plan view of the penetration electrode and the electrode pad portion when being viewed from a pad opening side in the camera module according to the embodiment.

The penetration electrode and the electrode portion in the camera module according to the embodiment will be described below in detail. FIG. 3 is an enlarged sectional view of the penetration electrode and the electrode pad portion in the camera module. FIG. 4 is a plan view of the penetration electrode and the electrode portion when being viewed from a pad opening side. FIGS. 3 and 4 show the penetration electrode and the electrode portion up to the passivation film 26 formed on the insulating interlayer 24, and do not show members formed on the passivation film 26.

In FIG. 3, as described above, a penetration electrode 36 extending from the second main surface of the silicon semiconductor substrate 10 to the first main surface thereof is formed. The internal electrode 32 is formed on the first main surface of the silicon semiconductor substrate 10 through the insulating interlayer 23. In the insulating interlayer 23 between the conductor layer 36 and the internal electrode 32, the contact plug 37 is formed. The contact plug 37, as shown in FIG. 4, is arranged in a region in which the penetration electrode 36 and the insulating interlayer 23 are in contact with each other when viewed from a direction perpendicular to the first main surface, i.e., when viewed from the pad opening side. In FIGS. 3 and 4, reference numeral 41 denotes a region in which the penetration electrode 36 and the insulating interlayer 23 are in contact with each other, and reference numeral 42 denotes an outer shape of the through-hole on the first main surface.

A method of manufacturing a penetration electrode in the camera module according to the embodiment will be described below. FIGS. 5 to 10 are sectional views of steps showing the method of manufacturing a penetration electrode in the camera module.

Figure 5:
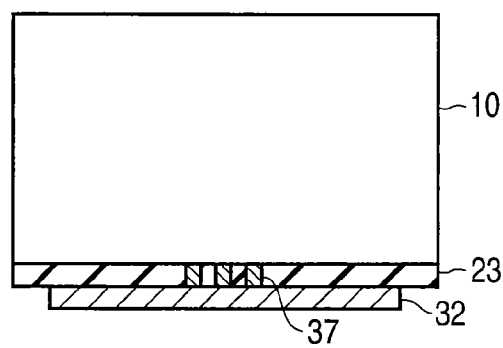
FIG. 5 is a sectional view of a first step showing a method of manufacturing the penetration electrode in the camera module according to the embodiment.

As shown in FIG. 5, the insulating interlayer 23 is formed on the first main surface of the silicon semiconductor substrate 10. Subsequently, the contact plug 37 is formed on the insulating interlayer 23, and the internal electrode 32 is formed on the contact plug 37 and the insulating interlayer 23. In this manner, the silicon semiconductor substrate 10 and the internal electrode 32 are connected to each other through the contact plug 37. The contact plug 37 is formed as follows. After a hole is formed in the insulating interlayer 23 by a photolithography process, a metal material, for example, tungsten (W) is deposited on the insulating interlayer 23 to bury the hole with tungsten. Subsequently, an excessive tungsten on the insulating interlayer 23 is polished by the chemical mechanical polishing (CMP) process. Thereafter, the internal electrode 32, for example, an aluminum (Al) film or a copper (Cu) film is formed on the insulating interlayer 23.

Figure 6:
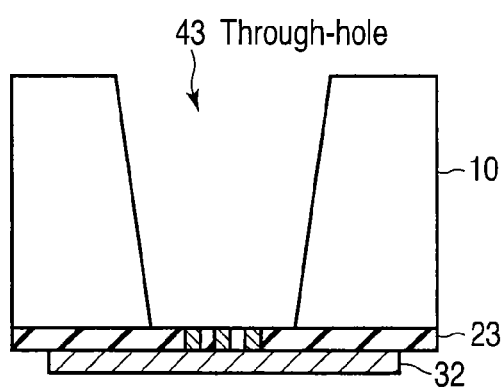
FIG. 6 is a sectional view of a second step showing the method of manufacturing the penetration electrode in the camera module according to the embodiment.
Figure 7:
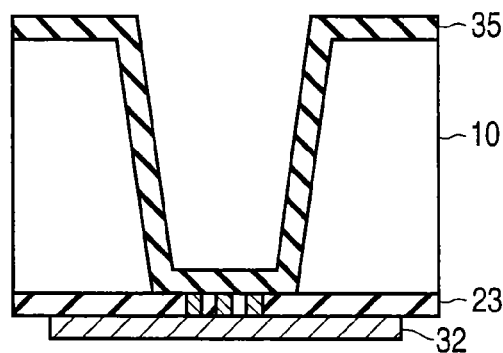
FIG. 7 is a sectional view of a third step showing the method of manufacturing the penetration electrode in the camera module according to the embodiment.
Figure 8:
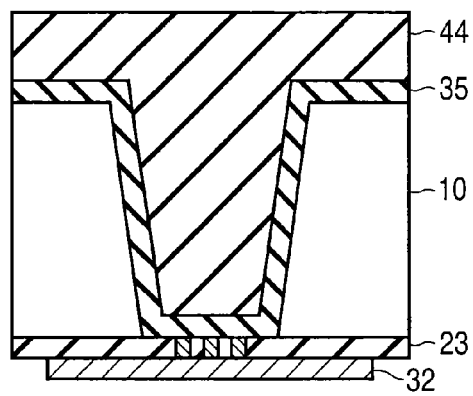
FIG. 8 is a sectional view of a fourth step showing the method of manufacturing the penetration electrode in the camera module according to the embodiment.
Figure 9:
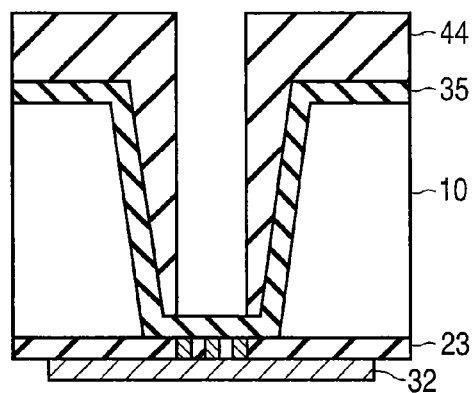
FIG. 9 is a sectional view of a fifth step showing the method of manufacturing the penetration electrode in the camera module according to the embodiment.

As shown in FIG. 6, a through-hole 43 is formed in the silicon semiconductor substrate 10. Subsequently, as shown in FIG. 7, the insulating film 35 is formed on the internal surface of the through-hole 43, i.e., on the side surface and the bottom surface (surface of the insulating interlayer 23) of the through-hole 43. Thereafter, as shown in FIG. 8, a resist 44 is coated on the insulating film 35, and, as shown in FIG. 9, the resist 44 is patterned by a photolithography process.

Figure 10:
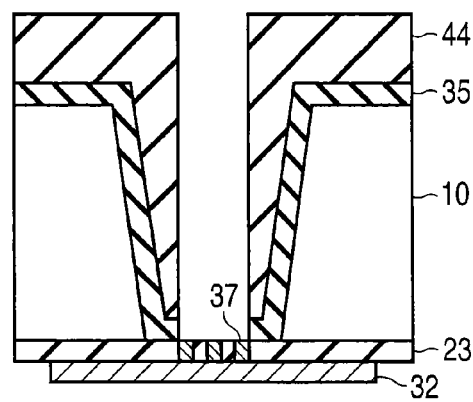
FIG. 10 is a sectional view of a sixth step showing the method of manufacturing the penetration electrode in the camera module according to the embodiment.

As shown in FIG. 10, the insulating film 35 which is not protected by the resist 44 is removed. More specifically, the insulating film 35 on the insulating interlayer 23 on which the contact plug 37 is formed is removed. Thereafter, after the resist 44 is peeled, as shown in FIG. 3, the conductor layer 36 is formed on the insulating film 35, the contact plug 37, and the insulating interlayer 23. With the above operations, a penetration electrode (conductor layer) connected to the internal electrode 32 through the contact plug 37 is manufactured.

According to the embodiment having the above structure, the penetration electrode (conductor layer) 36 and the internal electrode 32 are connected by the contact plug 37 to make it possible to omit a process of forming a through-hole in the insulating interlayer 23 on the first main surface. In this manner, since the thickness of the resist 44 can be reduced, a patterning time for the resist 44 can be shortened, and a manufacturing cost can be reduced. Furthermore, since the resist 44 can be thinned, damage to the insulating film 35 by plasma asher used when the resist 44 is peeled can be reduced. In this manner, short circuits occurring between the penetration electrode 36 and the silicon semiconductor substrate 10 can be reduced.

In the example described above, two electrodes (internal electrode 32 and element surface electrode 33) are arranged. However, an electrode may be arranged in at least one layer. For example, one electrode pad or a plurality of electrode pads may be arranged in the insulating interlayer 24 between the internal electrode 32 and the element surface electrode 33. In this case, three interconnection layers 25 are formed in the insulating interlayer 24.

In the pad opening 40 above the element surface electrode 33, an opening end position of the passivation film 26 is different from opening end positions of the base layer 27, the overcoat 29, the styrene resin layer 39 to form a step. However, the pad opening 40 may be formed such that the opening end positions are matched with each other. A step may be formed but need not be formed between the opening end position of the overcoat 29 and the opening end position of the styrene resin layer 39. Furthermore, in the example, openings are formed in the passivation film 26, the base layer 27, the overcoat 29, and the styrene resin layer 39 to obtain the pad opening 40. However, a structure in which the openings in the films and the pad opening are not formed may be used.

The embodiment of the present invention provides a solid-state imaging device which can reduce defects due to short-circuit occurring between a silicon substrate and a conductor layer in a penetration electrode formed in a through-hole in a silicon substrate.

The embodiment described above is merely an exemplary embodiment, and various embodiments can be configured by changing the above constituents or adding various constituents.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a solid-state imaging device comprising:
   forming an imaging element on a first main surface of a semiconductor substrate;
   forming a first insulating interlayer on the first main surface of the semiconductor substrate;
   forming a first contact plug in the first insulating interlayer;
   forming a first electrode on the first insulating interlayer and first contact plug;
   forming a through-hole from a second main surface of the semiconductor substrate opposite to the first main surface to a surface of the first insulating interlayer;
   forming an insulating film on a side surface of the through-hole and on the surface of the first insulating interlayer;
   removing the insulating film on the surface of the first insulating interlayer in the through-hole;
   forming a penetration electrode on the first contact plug, the insulating film, and the first insulating interlayer in the through-hole;
   forming a second insulating interlayer on the first electrode;
   forming a second electrode on the second insulating interlayer;
   forming a passivation film on the second electrode and the second insulating interlayer to have an opening, the opening partially exposing the second electrode; and
   forming a second contact plug between the first electrode and the second electrode to electrically connect the first electrode and the second electrode to each other.

2. The method of manufacturing the solid-state imaging device according to claim 1,
   wherein the first contact plug electrically connects the penetration electrode and the first electrode to each other.

3. The method of manufacturing the solid-state imaging device according to claim 1,
   wherein, when viewed from a direction perpendicular to the first main surface of the semiconductor substrate, the first contact plug is arranged in a region in which the penetration electrode and the first insulating interlayer are in contact with each other.

4. The method of manufacturing the solid-state imaging device according to claim 1,
   wherein, when viewed from a direction perpendicular to the first main surface of the semiconductor substrate, the second contact plug is arranged in a region which does not overlap the through-hole.

5. The method of manufacturing the solid-state imaging device according to claim 1,
   wherein, when viewed from a direction perpendicular to the first main surface of the semiconductor substrate, the second contact plug is arranged in a region which does not overlap the opening held in the passivation film.

6. The method of manufacturing the solid-state imaging device according to claim 1, further comprising:
   forming a color filter on the imaging element to correspond to the imaging element; and
   forming a microlens on the color filter.

7. The method of manufacturing the solid-state imaging device according to claim 6, further comprising:
   forming an optically transparent support substrate above the semiconductor substrate; and forming an adhesive agent which causes the semiconductor substrate and the optically transparent support substrate to adhere to each other.

8. The method of manufacturing the solid-state imaging device according to claim 7,
wherein a cavity is present between the microlens and the optically transparent support substrate.

9. The method of manufacturing the solid-state imaging device according to claim 8, further comprising forming an imaging lens above the optically transparent support substrate.

10. A method of manufacturing a solid-state imaging device comprising:
forming an imaging element on a first main surface of a semiconductor substrate;
forming a first insulating interlayer on the first main surface of the semiconductor substrate;
forming first contact plugs in the first insulating interlayer;
forming a first electrode on the first insulating interlayer and the first contact plugs;
forming a through-hole from a second main surface of the semiconductor substrate opposite to the first main surface to a surface of the first insulating interlayer;
forming an insulating film on a side surface of the through-hole and on the surface of the first insulating interlayer;
removing the insulating film on the surface of the first insulating interlayer in the through-hole; and
forming a penetration electrode on the first contact plugs, the insulating film, and the first insulating interlayer in the through-hole;
forming a second insulating interlayer on the first electrode;
forming a second electrode on the second insulating interlayer;
forming a passivation film on the second electrode and the second insulating interlayer to have an opening, the opening partially exposing the second electrode; and
forming a second contact plug between the first electrode and the second electrode to electrically connect the first electrode and the second electrode to each other.

11. The method of manufacturing the solid-state imaging device according to claim 10,
wherein the first contact plugs electrically connects the penetration electrode and the first electrode to each other.

12. The method of manufacturing the solid-state imaging device according to claim 10,
wherein, when viewed from a direction perpendicular to the first main surface of the semiconductor substrate, the first contact plugs are arranged in a region in which the penetration electrode and the first insulating interlayer are in contact with each other.

13. The method of manufacturing the solid-state imaging device according to claim 10,
wherein, when viewed from a direction perpendicular to the first main surface of the semiconductor substrate, the second contact plug is arranged in a region which does not overlap the through-hole.

14. The method of manufacturing the solid-state imaging device according to claim 10,
wherein, when viewed from a direction perpendicular to the first main surface of the semiconductor substrate, the second contact plug is arranged in a region which does not overlap the opening held in the passivation film.

15. The method of manufacturing the solid-state imaging device according to claim 10, further comprising:
forming a color filter on the imaging element to correspond to the imaging element; and
forming a microlens on the color filter.

16. The method of manufacturing the solid-state imaging device according to claim 15, further comprising:
forming an optically transparent support substrate above the semiconductor substrate; and
forming an adhesive agent which causes the semiconductor substrate and the optically transparent support substrate to adhere to each other.

17. The method of manufacturing the solid-state imaging device according to claim 16,
wherein a cavity is present between the microlens and the optically transparent support substrate.

18. The method of manufacturing the solid-state imaging device according to claim 17, further comprising forming an imaging lens above the optically transparent support substrate.

* * * * *